United States Patent
Caldwell

(10) Patent No.: US 6,552,907 B1
(45) Date of Patent: Apr. 22, 2003

(54) BGA HEAT BALL PLATE SPREADER, BGA TO PCB PLATE INTERFACE

(75) Inventor: Barry Caldwell, Hesston, KS (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/975,110

(22) Filed: Oct. 11, 2001

(51) Int. Cl.⁷ .................................................. H05K 7/20
(52) U.S. Cl. ........................ 361/708; 174/252; 361/719; 361/720
(58) Field of Search ................... 165/80.2, 80.3, 165/185; 174/16.3, 252; 257/706–707, 712–713, 722; 361/704–705, 707–708, 709–710, 717–721

(56) References Cited

U.S. PATENT DOCUMENTS

| | | | |
|---|---|---|---|
| 3,391,242 A | * | 7/1968 | Sudges ........................ 174/16.3 |
| 4,151,547 A | * | 4/1979 | Rhoades et al. ............. 174/16.3 |
| 4,541,005 A | * | 9/1985 | Hunter et al. ............... 174/16.3 |
| 4,654,754 A | * | 3/1987 | Daszkowski ................. 361/704 |
| 5,710,459 A | * | 1/1998 | Teng et al. ................... 361/719 |
| 5,777,385 A | * | 7/1998 | Wu ............................... 257/712 |
| 5,794,684 A | * | 8/1998 | Jacoby ......................... 165/80.3 |
| 5,933,324 A | * | 8/1999 | Barrett ......................... 361/707 |

* cited by examiner

Primary Examiner—Gregory Thompson
(74) Attorney, Agent, or Firm—Suiter & Associates

(57) ABSTRACT

The present invention is directed to a heat dissipation structure for an integrated circuit package, comprising a thermally conductive solid layers, one of which has receptacles for holding a thermally conductive flowable material, the heat dissipation structure being placed between the electronic component and the printed circuit board. The present invention is used advantageously with a primary heat sink placed on the top side of the integrated circuit package away from the printed circuit board. The heat dissipation structure preferably hemispherical balls on the package side of a high heat conductive plate to improve heat transfer from the die to the integrated circuit, especially, BGA, substrate to PCB power planes for heat dissipation and leads to improved secondary heat transfer from IC die in BGA packages to the heat spreader power planes in the system PCB. The heat dissipation device allows retro-fit of the heat transfer/transfer mechanism or primary attachment.

33 Claims, 5 Drawing Sheets

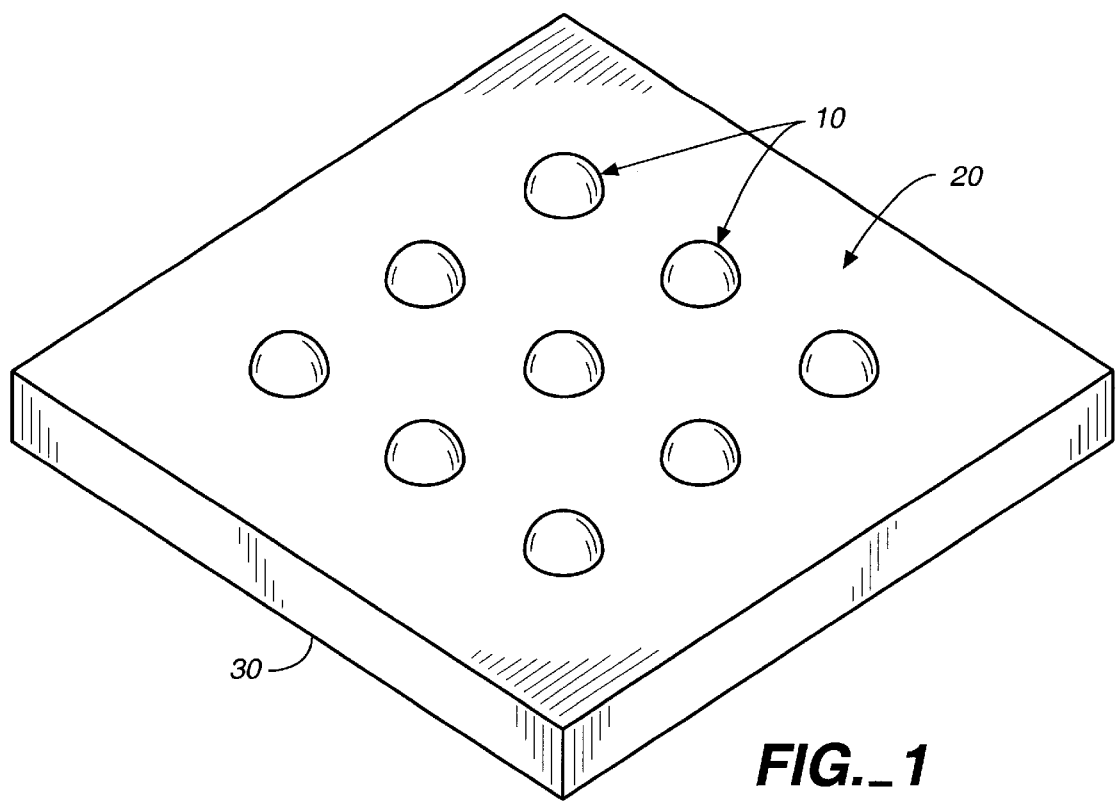
FIG._1
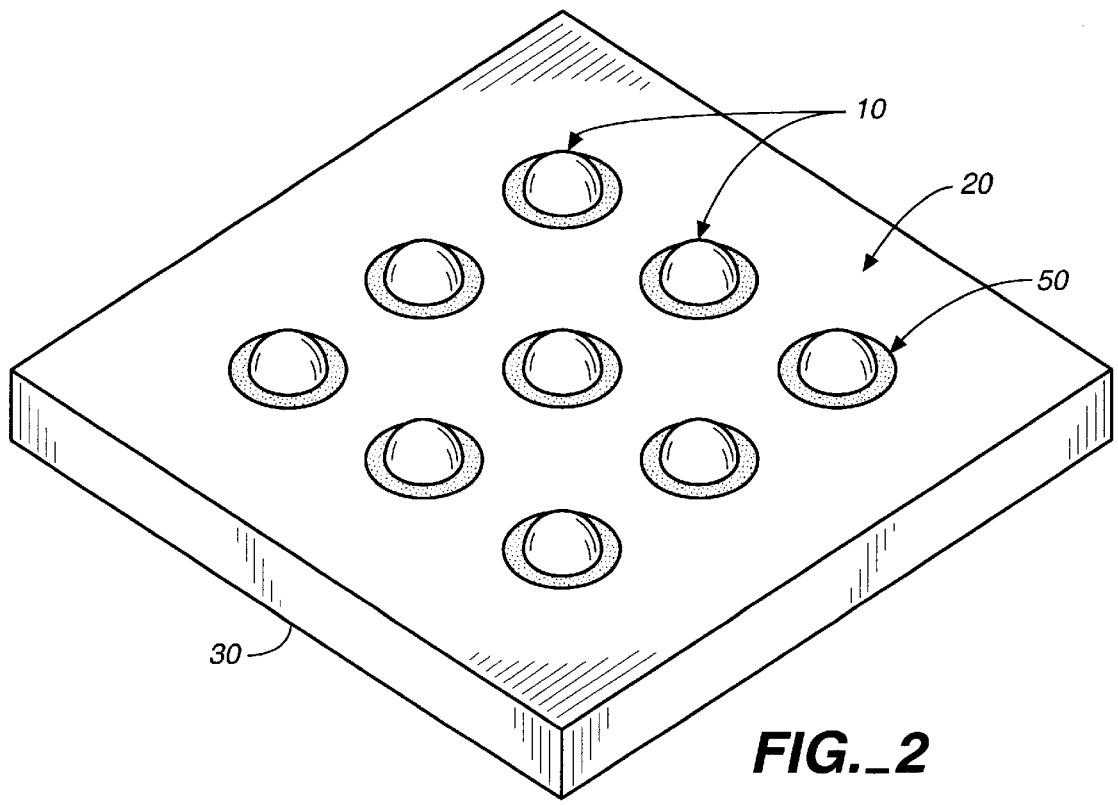
FIG._2

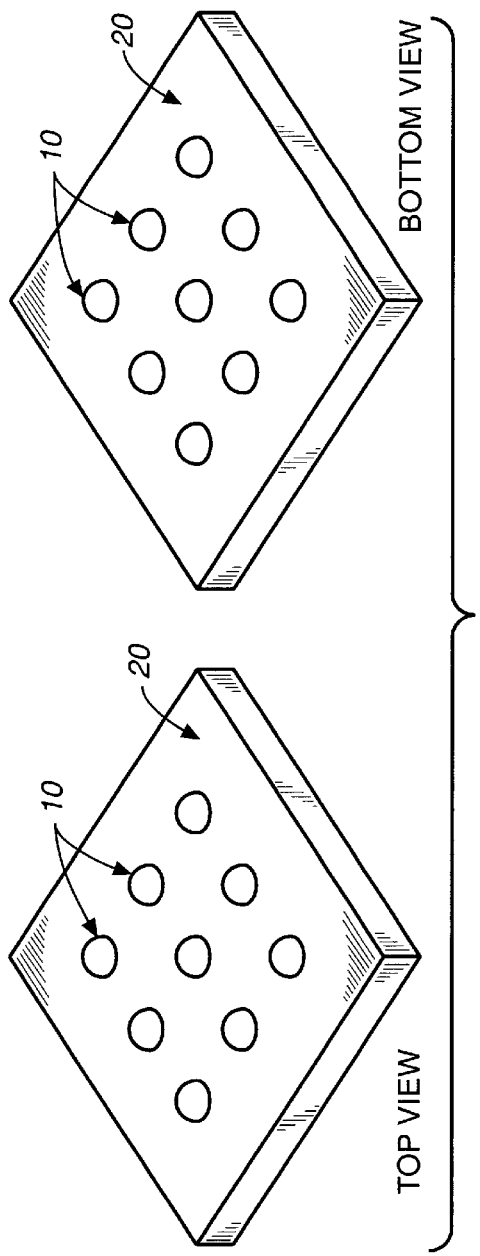
FIG._3
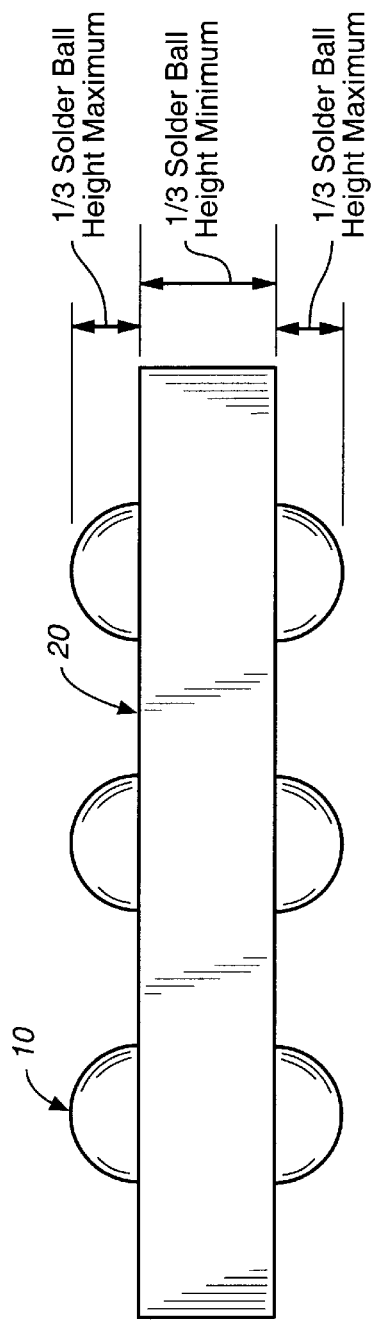
FIG._4

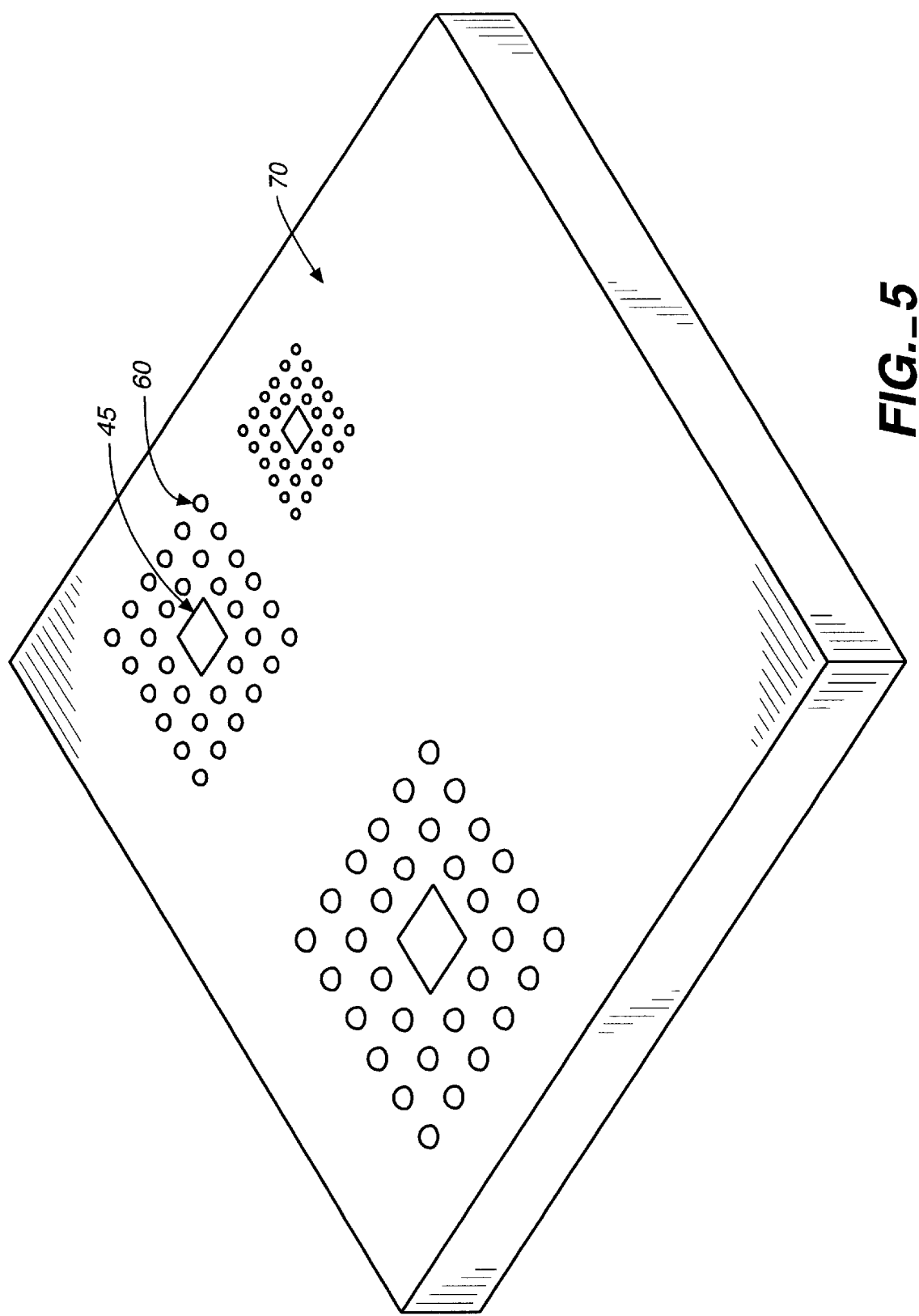
*FIG._5*

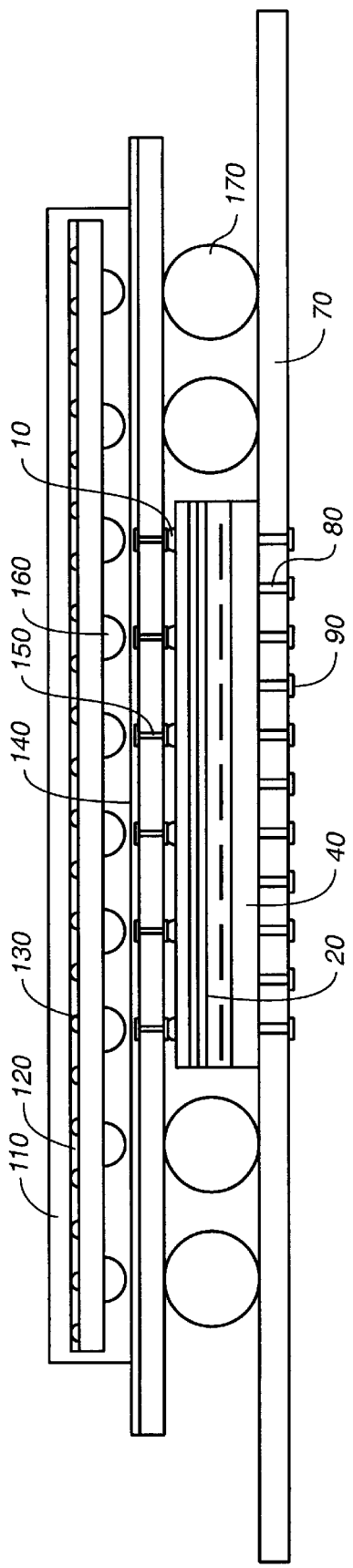
FIG._6
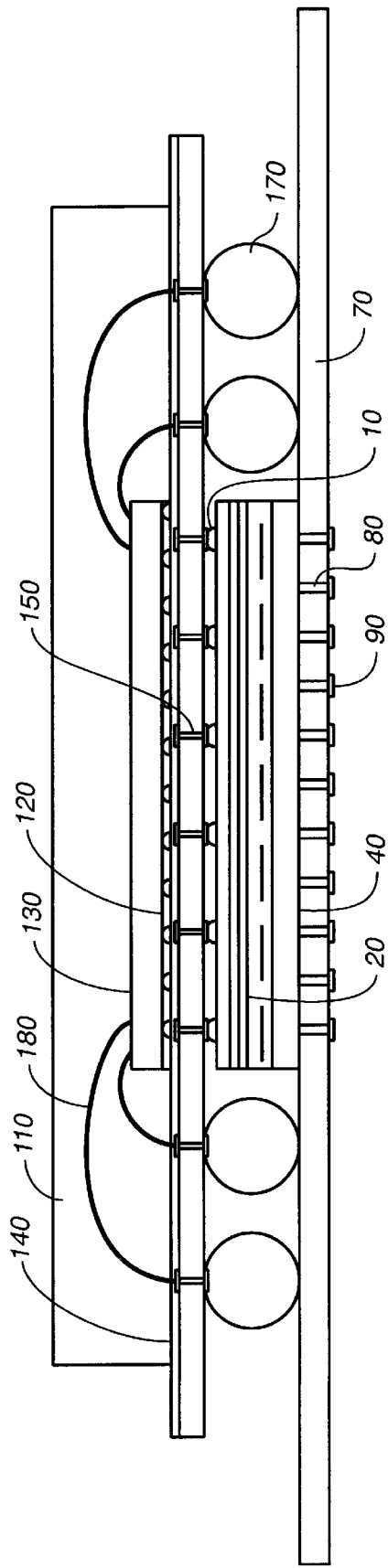
FIG._7

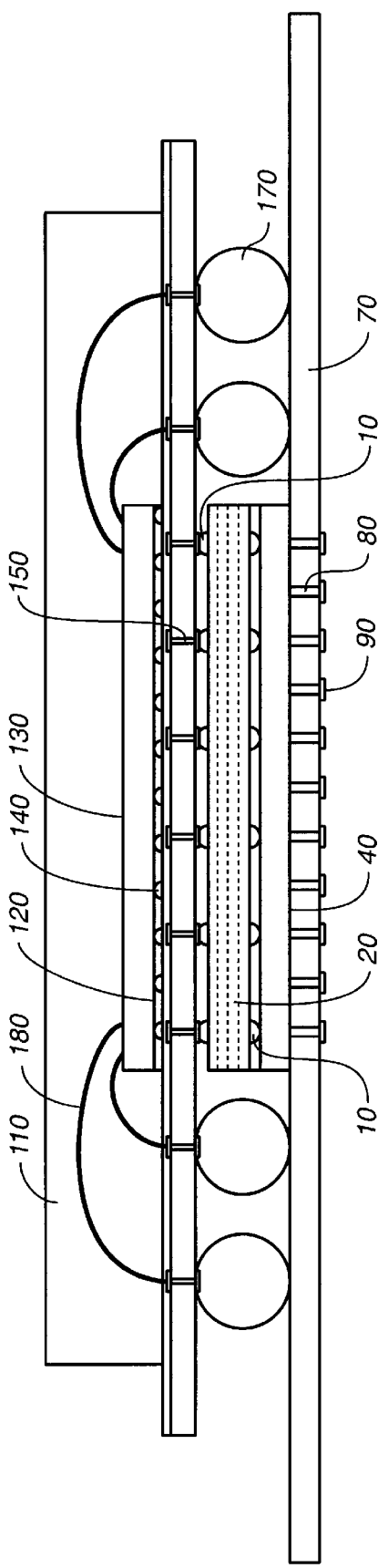
FIG._8
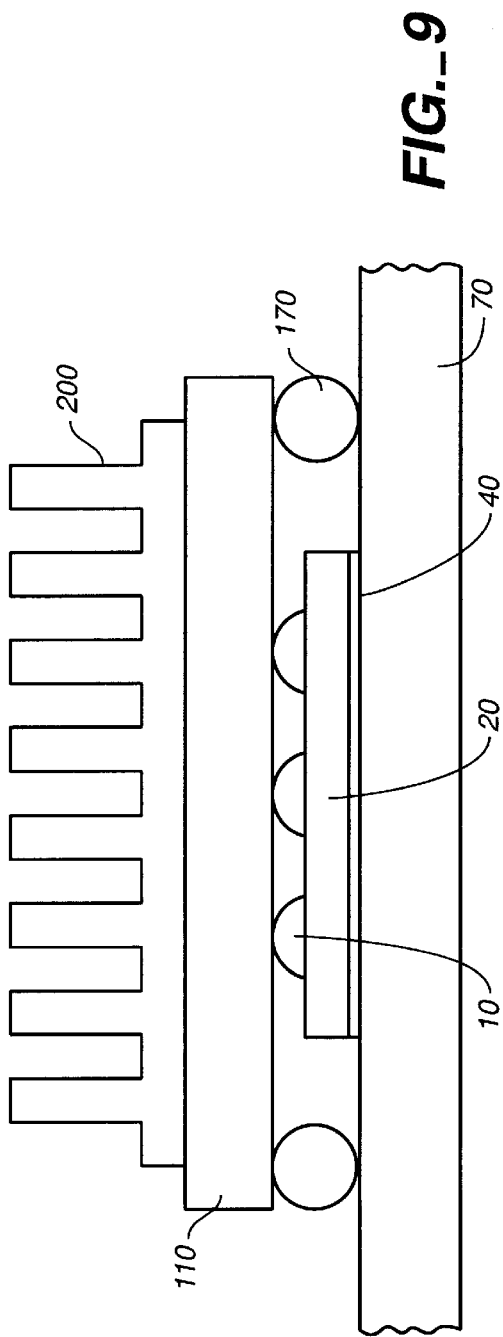
FIG._9

BGA HEAT BALL PLATE SPREADER, BGA TO PCB PLATE INTERFACE

FIELD OF THE INVENTION

The present invention generally relates to the field of computer boards and BGA IC packages, and particularly to a way to fit/retrofit a BGA package with an improved heat transfer mechanism between the BGA package and the printed circuit board (PCB) it is mounted on.

BACKGROUND OF THE INVENTION

Solder bonds are often used to attach integrated circuit (IC) packages to printed circuit boards. The printed circuit boards are specially designed for specific IC packages. The designer must pay close attention to various details such as signal propagation, power and ground routing, and heat dissipation. The printed circuit boards need to transmit signals along conductors fabricated in layers throughout the board in which signals may cross layers through vias. Power and ground planes also exist in the printed circuit board. A known method of attaching an IC to a printed circuit board involves the use of an array of solder balls, i.e., a ball grid array (BGA). The IC package is electrically connected with and mechanically bound to a printed circuit board by heating the assembly until the solder balls of the array flow to connect to terminals on the printed circuit board. Thus, the IC package is connected to its corresponding custom designed substrate or circuit board.

To enhance heat dissipation, a heat sink may be placed on the top air surface of the BGA package.

The increasing miniaturization in the semiconductor industry is presenting a set of challenges for the IC packaging industry. With ever increasing capability on ever smaller substrates and the fierce competition in the industry, it is necessary for new package technology development to contain costs. Therefore, the thermal, electrical, mechanical, and assembly characteristics of each IC package design must be optimally tailored.

A need exists for retrofitting PCB components with heat dissipation devices to improve circuit performance.

Also, as components become increasingly miniaturized, there is a need for a heat dissipation structure which does not take up additional volume beyond the PCB and its component parts.

Additionally, there is a need for enhanced secondary mechanisms to support heat transfer away from the package and IC die of emerging packages and die inside with increased power usage which already have a primary heat radiation mechanism.

Therefore, it would be desirable to provide an improved way to transfer heat from BGA packages and die within them to the PCB on which they are mounted on.

SUMMARY OF THE INVENTION

Accordingly, the present invention is directed to a heat dissipation structure for an integrated circuit package. In a first aspect of the present invention, a heat dissipation structure is disclosed for an electronic component mounted on a printed circuit board, comprising a thermally conductive layer with receptacles for holding a thermally conductive flowable material, the heat dissipation structure being placed between the electronic component and the printed circuit board.

In a second aspect of the invention, an arrangement of components is disclosed, comprising, in the following order, a primary heat sink, an integrated circuit package, a secondary heat sink, and a printed circuit board.

In the present invention, under the integrated circuit package, the heat sink uses hemispherical balls on the package side of a high heat conductive plate to improve heat transfer from the die or integrated circuit, especially, BGA, substrate to PCB power planes for heat dissipation.

The present invention leads to improved secondary heat transfer from IC die in BGA packages to the heat spreader power planes in the system PCB.

The present invention provides a heat dissipation structure which does not take up additional volume beyond the PCB and its component parts.

The present invention allows either retrofitting of the heat transfer mechanism or attachment during assembly.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which: drawings.

FIG. 1 illustrates a heat spreader plate with integral bumps of the present invention;

FIG. 2 illustrates a heat spreader plate with attachment bumps of the present invention;

FIG. 3 illustrates top and bottom views of a heat spreader plate with bumps on two sides;

FIG. 4 illustrates a cross sectional view of a heat spreader plate with bumps on both sides;

FIG. 5 illustrates the PCB with PCB land pads and signal pads;

FIG. 6 illustrates a cut away view of a flip chip BGA package with a heat dissipation structure of the present invention mounted underneath;

FIG. 7 illustrates a cut away view of a signal wire bond BGA package with a heat dissipation structure of the present invention mounted underneath; and FIG. 8 illustrates a cutaway view of a signal wire bond BGA package with a heat dissipation structure of the present invention mounted underneath.

FIG. 9 illustrates an externally facing optional heat sink.

DETAILED DESCRIPTION OF THE INVENTION

Reference will now be made in detail to the presently preferred embodiments of the invention, examples of which are illustrated in the accompanying drawings.

Referring generally now to FIGS. 1 through 8, exemplary embodiments of the present invention are shown.

Grid array semiconductor device packages, such as BGA packages, have terminals arranged as an array across the underside surface of the device package. This permits the physical size of grid array device packages to be smaller than other packages while having hundreds of terminals disposed on the package. Such smaller packages are highly desirable in portable device applications and hand-held communications devices. Because of the compactness, signal lines from chip I/O pads to device package terminals are shorter, meaning the high-frequency response of grid array device packages tends to be improved over that of other device packages.

Semiconductor devices generate heat by transforming electrical energy through various circuit resistances into heat energy. Certain operational characteristics are known to vary in a semiconductor device with temperature. Reliable operation occurs only within a given operating temperature range. Semiconductor device operation above a certain temperature may irreversibly damage the device. Also, it is known that reliable operation of a semiconductor device tends to decrease with increasing device temperature. The heat generated by a semiconductor device must be transferred away from the device into the surrounding environment. Some of the heat produced by an integrated circuit device flows from I/O pads to the PCB through the signal lines within the device package and the device package terminals.

The operational temperature of a semiconductor device package is determined by the temperature of the air surrounding the device package, the amount of electrical power dissipated by the chip, and the sum of thermal resistances of elements and interfaces along the heat transfer path from the chip to the surrounding air.

Cooling mechanisms, such as heat sinks, permit semiconductor devices to dissipate more electrical power than direct exposure to the air normally allows. When a heat sink is used, most of the heat generated through the device package to the heat sink and then on to the surrounding air.

The heat dissipation structure of the present invention is placed between and in contact with the BGA package and the PCB. The PCB may be of a fiber-epoxy material, FR4, Roger, GeTek, ceramic, or other suitably insulating and durable material. The heat dissipation structure consists of several layers designed to maintain thermally conductive contact with the BGA and PCB, in effect, acting as a spacer between them. In a preferred embodiment, the heat dissipation structure consists of a heat transfer spreader plate 30 and a smooth plate 40 and/or a PCB land pad 45 as well as flowable thermally conductive material between them to ensure good thermal conductivity and mechanical spacing and adhesion.

As shown in FIG. 1, a heat spreader plate 30 has a smooth land. It may be generally manufactured as a solid piece that is molded out of copper, aluminum, carbon fiber (such as carbon filament resin compound), or other thermally conductive material that has a high heat transfer coefficient and good thermal cohesive properties for high heat transfer. In this embodiment, the hemispherical bumps 10 are integrally formed with the body 20 and are distributed in a two-dimensional array. The bottom of the body 20 is flat. Although the invention has been disclosed as having hemispherical bumps, other bump shapes may be employed as long as they adequately connect to the vias of the semiconductor device to be attached.

In FIG. 2, attachment hemispherical bumps 10 are attached to the body 20 of the heat spreader plate 30 with solder or conductive heat transfer glue or other method of attachment which is sufficiently strong, durable, and thermally conductive. The attachment bumps 10 are not part of the plate. A recessed indentation 50 of the plate provides a mount for the attachment bumps 10. The indentation 50 holds the attachment material of the bump. The bottom of the heat spreader plate 30 is flat. The attachment bumps 10 may be lead-tin solder, no-lead solder, carbon fiber, silver, gold, or any other thermally conductive material.

FIG. 3 shows top and bottom views of a heat spreader plate 30 which has bumps 10 on both sides. This allows a retrofit into current BGAs and existing PCBs in which the PCBs lack a PCB land pad. This heat spreader plate 30 could be manufactured as a solid molded piece with integral bumps or as a plate with attachment bumps.

FIG. 4 is a cross section of the heat spreader plate 30. The bumps preferably have a maximum height of ⅓ of the height of the solder balls for signal line attachments between the BGA and the signal pads of the PCB. The body of the heat spreader plate 30 is at least ⅓ the height of the solder balls between the BGA that the heat spreader plate 30.

FIG. 5 shows the solder ball land pads 60 and the PCB land pad 45 of the PCB 70. Perforations would help to secure the PCB land pad 45 to the PCB 70 because thermally conductive flowable material such as solder when heated would flow through the holes and adhere the PCB land pad 45 better to the PCB 70. However, perforations are not necessary. The PCB land pad 45 is made of bare copper or other PCB metal plate such as gold plating or any thermally conductive material that has a high melting point, good thermal conductivity, and rigidity at high temperature.

FIG. 6 shows a cross section of an implementation of the heat spreader plate and a smooth plate 40 with a flip chip die. The die encapsulation 110 may be plastic or ceramic. A plastic BGA package is an industrial solution. Plastic BGA provides acceptable heat dissipation and is relatively low in cost. Ceramic BGA offers good thermal dissipation, adaptability to rugged environment, moisture resistance, and corrosion prevention. A smooth plate 40 is formed in parallel to the heat spreader plate 30. The smooth plate 40 may be a solid sheet or perforated. Perforations would help to secure the smooth plate 40 to the PCB land pad 50 because thermally conductive flowable material such as solder when heated would flow through the holes and adhere the smooth plate 40 to the PCB land pad 50. However, perforations are not necessary. The BGA flip chip has a die backer substrate 120, an active circuit part 130, and flip chip signal connect bumps 160 from the active circuit or die ground plane. The BGA substrate has a land pad 140 for signal interconnect and thermal and electrical connection. The land pad is formed on both sides of the via 150. Solder balls 170 connect the signal, power and ground signals from the BGA chip to the solder ball land pads of PCB 70. The thermal vias 80 are used to conduct heat from the PCB land pad into or through the PCB 70 for connection to areas of copper planes that are used for electrical power distribution. The PCB power planes may be used as heat absorption and radiation vehicles. A thermal via is a thermally conductive conduit through which heat is conducted. Thermal vias 80 may be formed by drilling holes through PCB 70 and filling the hole with a thermally conductive material such as copper. Alternatively, thermal vias 80 may be formed by drilling, routing, punching holes or slots, or the like in the PCB 70 and filling with an appropriate thermally conductive material. On the side of the PCB 70 opposite to the chip are lands 90.

The smooth plate 40, heat spreader plate 30 with solder balls 10, and thermally conductive bonding material need to be designed so these combined elements are scaled to just fit under the BGA package. Dictating this dimension are the sizes of the BGA balls 170. The currently used ball diameters are 1.27 mm, 1.00 mm, or 0.65 mm.

FIG. 7 shows an embodiment of the present invention with a wire bond chip die. Signal conduction wires 180 connect the active part of the die 130 with the lands 140 connected to the vias 150 which connect to lands, the solder balls 170, and the signal pads of the PCB 70.

FIG. 8 shows an embodiment of the present invention with a wire bond chip die in which bumps 10 are on both sides of the heat spreader plate 30.

Although the heat dissipation structure of the present invention could be used as the sole cooling means for the BGA package, it could also be used as a secondary cooling element for the BGA package. In the latter case, the primary cooling element could be a heat sink attached to the top of the BGA package. A heat sink typically includes multiple fins which increase the heat transfer capability of heat sink. Unfortunately, fins also may significantly increase the total volume occupied by heat sink as well as height of heat sink relative to the component side of PCB. Fins also add to the cost of heat sink. However, by utilizing the present invention as a secondary heat transfer device, the size of the primary cooling element need not be so great as it would be otherwise.

In assembly of the components on the PCB 70, a thermally conductive flowable material such as solder is first applied to the PCB land pad 45 on the PCB 70 reserved for placement of the heat dissipation structure. While the thermally conductive flowable material is kept liquid by application of heat, the smooth plate 40 is placed over it. Then, the heat spreader plate 30 with bumps 10 having another thermally conductive flowable material is placed over the smooth plate 40.

Afterward, the solder-covered bonding pads of a BGA device package are placed in physical contact with corresponding bonding pads of a PCB 70. In some cases, the solder-covered bonding pads of the BGA device package are then heated long enough for the solder to flow. In other cases, the bonding pads of the PCB 70 are coated with solder which melts at a lower temperature than that of the solder balls, and the bonding pads 60 of the PCB 70 are heated long enough for the solder thereupon to flow. In either case, when the solder cools, the bonding pads on the underside of the BGA device package are electrically and mechanically coupled to the corresponding bonding pads of the PCB 70.

In operation, a large portion of the heat generated by the BGA device package passes through the heat spreader plate 30, the bumps 10, the smooth plate 40, PCB land pad 45, and any intervening thermally conductive flowable material of the heat dissipation structure to the ground or power planes through PCB vias. Additionally, an externally facing optional heat sink 200 (as shown in FIG. 9) may be used to dissipate more heat away from the BGA package, if space permits its placement. A small portion of heat is also dissipated to the ambient air, but ambient air is not a very good heat conductor.

It is believed that the BGA HEAT BALL PLATE SPREADER, BGA TO PCB PLATE INTERFACE of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A heat dissipation structure for an electronic component mounted on a printed circuit board, comprising:
   a first thermally conductive layer with bumps of a first thermally conductive material, the bumps being capable of thermally conductive and physical attachment to an underside of an electronic component; and
   a second thermally conductive layer being generally parallel to the first thermally conductive layer and being placed in thermally conductive and physical contact with the first thermally conductive layer and a printed circuit board, the second thermally conductive layer being perforated.

2. The heat dissipation structure of claim 1, wherein at least one of the first and second thermally conductive layers includes at least one from the group consisting of aluminum, copper, and a carbon filament resin compound.

3. The heat dissipation structure of claim 1, wherein the thermally conductive material is in the form of hemispherical balls of solder.

4. The heat dissipation structure of claim 1, further comprising a second thermally conductive material applied between the second thermally conductive layer and a printed circuit board, at least one the first and second thermally conductive materials being a thermal glue.

5. The heat dissipation structure of claim 1, wherein the bumps are integrally molded with the first thermally conductive layer.

6. The heat dissipation structure of claim 1, wherein the first thermally conductive layer has recesses into which the bumps are physically attached.

7. The heat dissipation structure of claim 1, wherein the first thermally conductive layers further comprises bumps that are in thermally conductive and physical contact with the second thermally conductive layer.

8. An arrangement of components, comprising:
   an integrated circuit package;
   a printed circuit board to which the integrated circuit package is mounted; and
   a first heat sink disposed in thermally conductive and physical contact between the integrated circuit package and the printed circuit board, the first heat sink comprising a first thermally conductive solid layer having bumps which contain a first thermally conductive flowable material, the first heat sink further comprising a second thermally conductive solid layer in which the second thermally conductive solid layer is bonded to the printed circuit board and is thermally conductively coupled to the first thermally conductive solid layer.

9. The arrangement of components of claim 8, wherein the integrated circuit package is a ball grid array (BGA) package.

10. The arrangement of components of claim 8, wherein the second thermally conductive solid layer has perforations to allow at least one of the first and second thermally conductive flowable materials to pass through the perforations.

11. The arrangement of components of claim 8, wherein the first heat sink is thermally conductively connected to the power planes in the printed circuit board.

12. The arrangement of components of claim 8, wherein the printed circuit board is made of fiber epoxy or ceramic.

13. The arrangement of components of claim 8, wherein the printed circuit board is made of FR4 or GeTek.

14. The arrangement of components of claim 8, wherein the first heat sink is surrounded by solder balls connecting the printed circuit board with the integrated circuit package.

15. The arrangement of components of claim 8, wherein the printed circuit board has a land pad to which the second thermally conductive layer is thermally conductively and physically attached.

16. The arrangement of components of claim 8, wherein the integrated circuit package and the printed circuit board have vias and lands for thermally conductively attaching to the first heat sink.

17. The arrangement of components of claim 8, wherein the integrated circuit package includes a flip chip die.

18. The arrangement of components of claim 8, wherein the integrated circuit includes a wire bond die.

19. The arrangement of components of claim 8, further comprising a second heat sink, the second heat sink primarily disposed on the side of the integrated circuit package opposite to the first heat sink.

20. A heat dissipation structure for placement between an integrated circuit chip and a circuit board, comprising:
   a first layer of thermally conductive bumps capable of being placed in thermally conductive and physical contact with an underside of an integrated circuit chip; and
   a first solid, thermally conductive, and planar plate having recesses, the first solid, thermally conductive, and planar plate being placed in thermally conductive and physical contact with the underside of the first layer of thermally conductive bumps through the recesses of the first solid, thermally conductive, and planar plate, the first solid, thermally conductive, and planar plate being mounted upon a circuit board.

21. The heat dissipation structure of claim 20, further comprising a second layer of thermally conductive bumps being in thermally conductive and physical contact with the first solid, thermally conductive, and planar plate, the second layer of thermally conductive bumps being disposed on an underside of the first solid, thermally conductive, and planar plate.

22. The heat dissipation structure of claim 20, the thermally conductive bumps being hemispherical in shape.

23. The heat dissipation structure of claim 20, the thermally conductive bumps having a maximum height of ⅓ the diameter of a solder ball used to mount an integrated circuit chip to a circuit board.

24. A heat dissipation structure for placement between an integrated circuit chip and a circuit board, comprising:
   a first layer of thermally conductive bumps capable of being placed in thermally conductive and physical contact with an underside of an integrated circuit chip;
   a first solid, thermally conductive, and planar plate being placed in thermally conductive and physical contact with the underside of the first layer of thermally conductive bumps, and planar plate; and
   a second layer of thermally conductive bumps being in thermally conductive and physical contact with the first solid, thermally conductive, and planar plate, the second layer of thermally conductive bumps being disposed on an underside of the first solid, thermally conductive, and planar plate, the second layer of thermally conductive bumps capable of being in thermally conductive and physical contact with a circuit board.

25. The heat dissipation structure of claim 24, wherein the thermally conductive bumps of the first and second layers of thermally conductive bumps are hemispherical in shape.

26. The heat dissipation structure of claim 24, wherein the thermally conductive bumps of the first and second layers of thermally conductive bumps have a maximum height of ⅓ the diameter of a solder ball used to mount an integrated circuit chip to a circuit board.

27. The heat dissipation structure of claim 24, wherein the thermally conductive bumps of the first and second layers of thermally conductive bumps are of a uniform size.

28. The heat dissipation structure of claim 24, wherein the bumps are integrally molded with the first solid, thermally conductive, and planar plate.

29. A heat dissipation structure for an integrated circuit that is capable of being placed between an integrated circuit and a printed circuit board, comprising:
   a layer of bump material capable of being placed in direct physical and thermally conductive contact with an underside of an integrated circuit;
   a first solid, thermally conductive, and flat layer in direct physical and thermally conductive contact with an underside of the layer of bump material; and
   a second solid, thermally conductive, and flat layer in direct physical and thermally contact with an underside of the first solid, thermally conductive, and flat layer, the second solid, thermally conductive, and flat layer capable of being mounted in direct physical and thermally conductive contact with a printed circuit board.

30. The heat dissipation structure of claim 29, wherein the second solid, thermally conductive, and flat layer is unperforated.

31. The heat dissipation structure of claim 29, wherein the second solid, thermally conductive, and flat layer is uncorrugated.

32. The heat dissipation structure of claim 29, wherein the second solid, thermally conductive, and flat layer is a land pad.

33. The arrangement of components of claim 8, wherein the second thermally conductive solid layer is a printed circuit board land pad.

* * * * *